United States Patent [19]
Joo

[11] Patent Number: 5,879,957
[45] Date of Patent: Mar. 9, 1999

[54] METHOD FOR MANUFACTURING A CAPACITOR

[75] Inventor: Jae Hyun Joo, Chungcheongbuk-do, Rep. of Korea

[73] Assignee: LG Semicon Co., Ltd., Chungcheongbuk-do, Rep. of Korea

[21] Appl. No.: 878,815

[22] Filed: Jun. 19, 1997

[30] Foreign Application Priority Data

Dec. 3, 1996 [KR] Rep. of Korea .................. 1996-61252

[51] Int. Cl.$^6$ .............................................. H01L 21/8242
[52] U.S. Cl. ................................. 438/3; 438/240
[58] Field of Search .............................. 438/3, 238, 239, 438/240, 381; 257/306, 310

[56] References Cited

U.S. PATENT DOCUMENTS

| | | | |
|---|---|---|---|
| 5,005,102 | 4/1991 | Larson ..................................... | 361/313 |
| 5,335,138 | 8/1994 | Sandhu et al. ........................... | 361/303 |
| 5,555,486 | 9/1996 | Kingon et al. ........................... | 361/305 |
| 5,576,928 | 11/1996 | Summerfelt et al. .................... | 438/240 |
| 5,585,300 | 12/1996 | Summerfelt ............................. | 438/240 |

OTHER PUBLICATIONS

The Superiority of Ru Electrodes for Gigabit DRAMs, N. Mikami et al, ISIF, 1996.

An ECR MOCVD (Ba,Sr)TiO3 based stacked capacitor technology with RuO2/Ru/TiN/TiSix storage nodes for Gbit-scale DRAM, S. Yamamichi, et al., 1995 IEEE IEDM 95–119, pp. 5.3.1–5.3.4.

*Primary Examiner*—Joni Chang

[57] ABSTRACT

A capacitor of a semiconductor device and a method for manufacturing the same are disclosed for preventing generation of leakage current, simplifying the manufacturing process, and improving electric characteristics of the device. The capacitor includes a substrate, an insulating layer having a contact hole therein, a plug formed in the contact hole, a first conductive layer formed on the plug, a conductive oxide layer formed on the first conductive layer, a second conductive layer formed on the conductive oxide layer as part of a lower electrode, a dielectric layer formed on the entire surface inclusive of the lower electrode, and an upper electrode formed on the dielectric layer.

15 Claims, 9 Drawing Sheets

METHOD FOR MANUFACTURING A CAPACITOR

BACKGROUND OF THE INVENTION

1. Field of the Invention

The present invention relates to a semiconductor device and, more particularly, to a capacitor of a semiconductor device and a method for manufacturing the same.

2. Discussion of the Related Art

Generally as the capacity of a semiconductor memory device increases, the cell size of the semiconductor memory device decreases. Similarly, in DRAMs (Dynamic Random Access Memories) a decrease in the cell size causes a decrease in the capacitor size. To compensate the decrease in the capacitor size, the thickness of a dielectric layer is gradually decreased. As the thickness of the dielectric layer decreases, however, more leakage current is generated due to tunneling. This reduces reproducibility and reliability of the semiconductor memory device.

In order to prevent such problems, a method of forming a surface with complicated roughness is utilized to increase the effective area of the capacitor. In this method, however, it is difficult to perform a photolithography process because a significant step coverage is formed on the surface, which increases the process cost. Therefore, this method has been found to be unsuitable for highly integrated devices.

Research and development has been directed to innovatively improving the capacity of a capacitor of a semiconductor device and to reducing the surface roughness. One of the methods proposed in this endeavor utilizes materials of high dielectric constant for forming a dielectric film of the capacitor. This provides various positive effects, except that a dielectric constant of such capacitor is not sufficiently high. As a result, such dielectric films do not provide a wide range of applicability, especially in highly integrated systems.

Recently, much attention has been given to ferroelectric substances having a crystal structure known as Perovskite type. Such a ferroelectric substance has become a research object possibly as a dielectric material usable for semiconductor devices.

A ferroelectric substance, in which spontaneous polarization under the Curie temperature appears, generates spontaneous polarization without the electric field. However, these ferroelectric substances easily react to silicon or silicide of a substrate. Further, their surfaces are exposed to strong oxidative circumstances so that they are likely to be oxidized during a thin film formation. PZT ($Pb(Zr,Ti)O_3$), PLZT (($Pb,La)(Zr,Ti)O_3$), BST (($Ba,Sr)TiO_3$), $BaTiO_3$, $SrTiO_3$, etc. are all examples of a ferroelectric substance.

In order to solve these problems, research and development has been continuously directed to discovering materials and structures which are suitable for electrodes.

Figure 1:
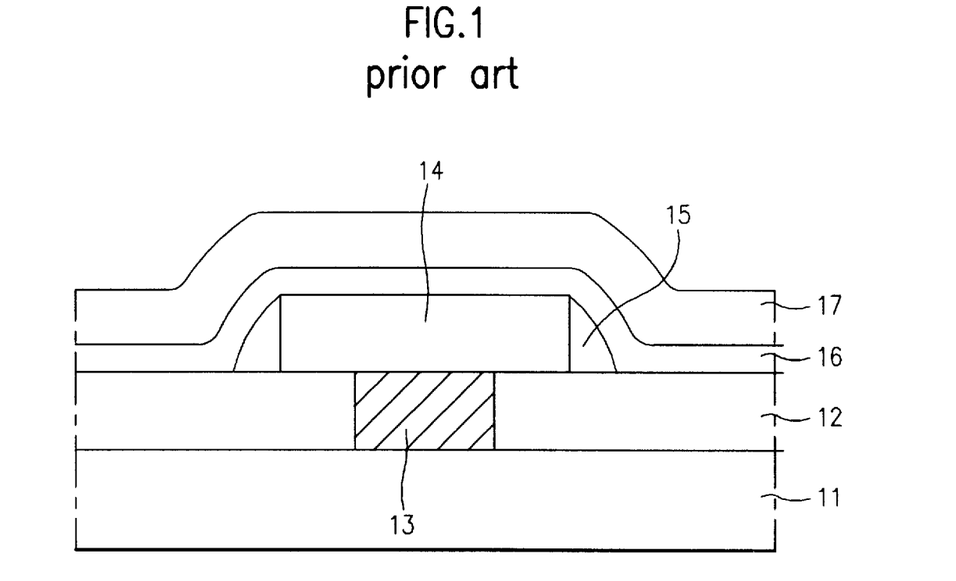
FIG. 1 is a cross-sectional view showing a conventional structure of a capacitor of a semiconductor device.

FIG. 1 shows a cross-sectional view of the structure of a conventional capacitor of a semiconductor device.

As shown in FIG. 1, an oxide layer 12 is formed on a silicon substrate 11. A predetermined portion of the substrate 11 is exposed to form a contact hole thereon through the oxide layer 12. A silicon plug 13 is formed filing the contact hole up to the top surface of the oxide layer 12. As a lower electrode of the conventional capacitor, a platinum (Pt) layer 14 is formed on the silicon plug 13 and the portions of the oxide layer 12 adjoining the silicon plug 13. Insulating sidewalls 15 are formed on the sides of the Pt layer 14 to provide step coverage for a dielectric layer 16. The dielectric layer 16 and an upper electrode 17 of the capacitor are successively formed on the entire surface inclusive of the Pt layer 14, thereby completing the conventional capacitor of a semiconductor device.

Figure 2:
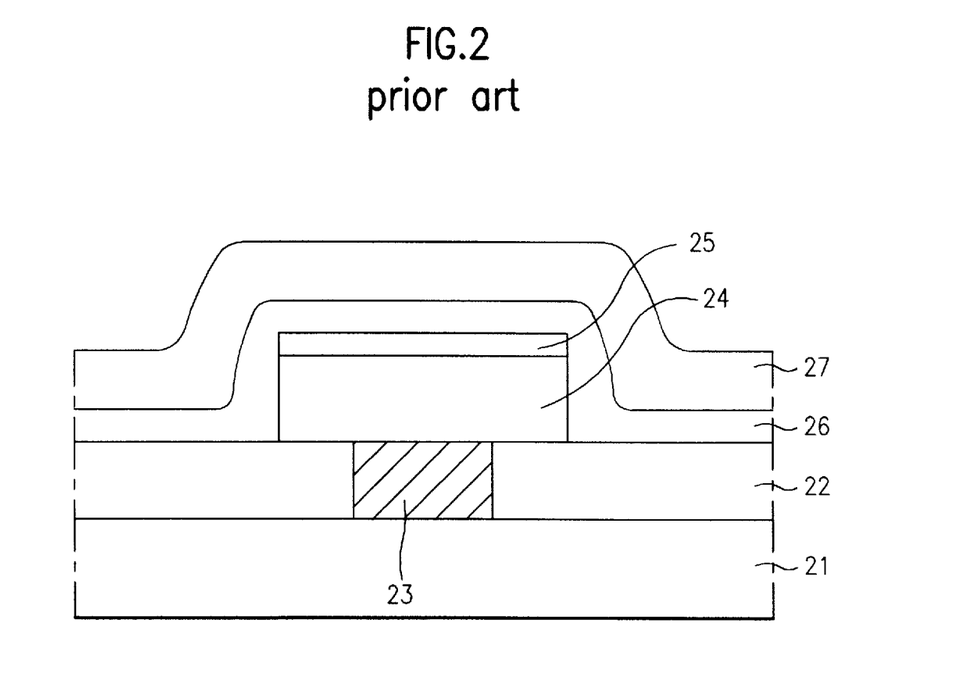
FIG. 2 is a cross-sectional view showing another conventional structure of a capacitor of a semiconductor device.

FIG. 2 is a cross-sectional view showing another structure of a conventional capacitor of a semiconductor device.

As shown in FIG. 2, an oxide layer 22 is formed on a silicon substrate 21 and a predetermined portion of the silicon substrate 21 is exposed to form a contact hole thereon through the oxide layer 22. A silicon plug 23 is formed filing the contact hole up to the top surface of the oxide layer 22. As a lower electrode, a ruthenium (Ru) layer 24 is formed on the silicon plug 23 and the portions of the oxide layer 22 adjoining the silicon plug 23. Subsequently, a ruthenium (RU) oxide 25 is formed on the RU layer 24. The lower electrode of the capacitor includes the RU layer 24 and the RU oxide 25. A dielectric layer 26 and an upper electrode 27 are formed on the entire surface inclusive of the lower electrode, thereby completing the conventional capacitor of a semiconductor device.

The above and other conventional capacitors of a semiconductor device have, however, the following problems.

Figure 3:
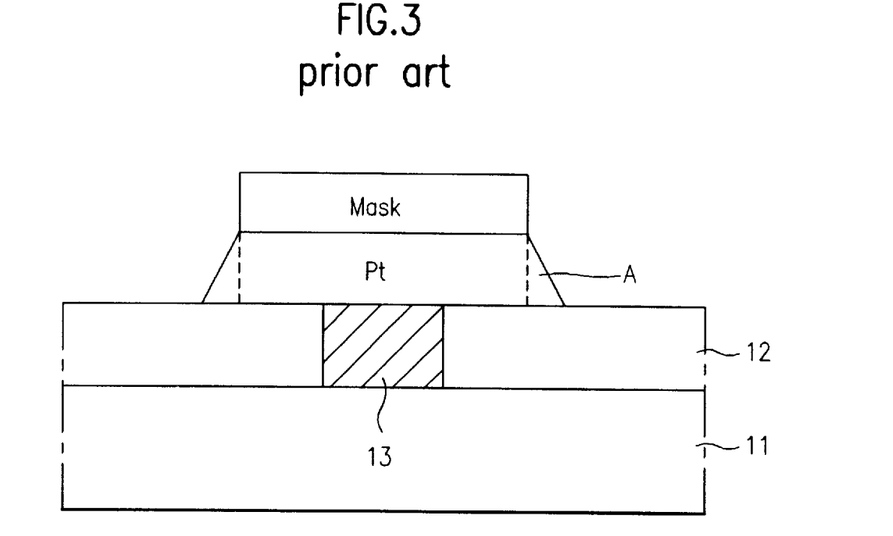
FIG. 3 is a cross-sectional view showing a general structure of a conventional thin Pt layer of the capacitor after a dry etch process.
Figure 4:
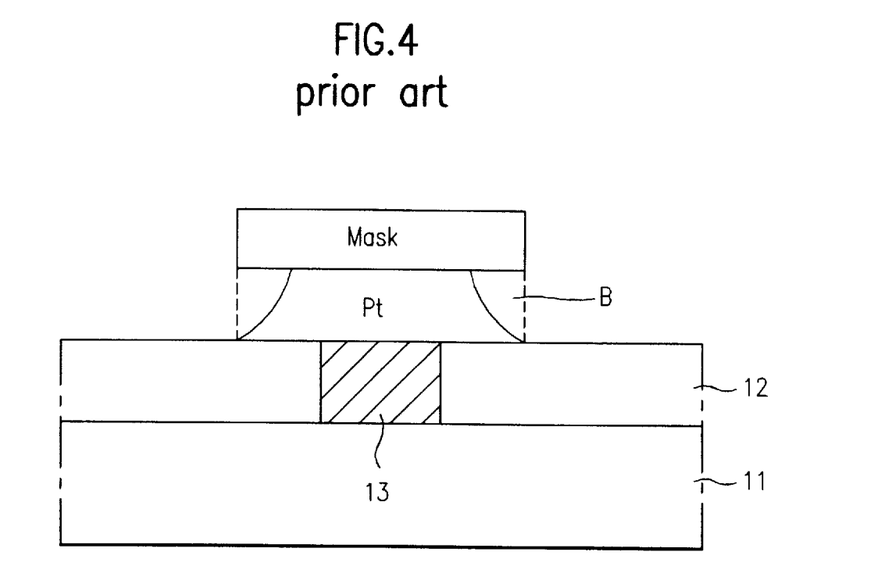
FIG. 4 is a cross-sectional view showing a general structure of a conventional thin Pt layer of the capacitor after a wet etch process.

First, as shown in FIG. 3 when forming a platinum layer pattern (Pt) on the plug 13 as a lower electrode using a mask and a dry etch process, a remnant A remains on the sides of the platinum layer so that an accurate Pt pattern cannot be obtained. On the other hand, if a wet etch process is used, under-cuts B as shown in FIG. 4 are formed and an accurate Pt pattern is difficult to achieve.

Second, in the conventional capacitor having a ruthenium layer as the electrode, a significant leakage current is generated because ruthenium has a smaller work function than platinum.

SUMMERY OF THE INVENTION

The present invention is directed to a capacitor of a semiconductor device and a method for manufacturing the same that substantially obviate one or more problems due to limitations and disadvantages of the related art.

An object of the invention is to provide a capacitor of a semiconductor device in which electric characteristics of an underside electrode of the capacitor are improved and at the same time, accurate patterning is easily achieved.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purposes of the present invention, as embodied and broadly described, the capacitor of a semiconductor device includes a substrate; an insulating layer having a contact hole on the substrate; a plug formed in the contact hole; a first conductive layer on the plug; a conductive oxide layer on the first conductive layer; a lower electrode having a second conductive layer on the conductive oxide layer; a dielectric layer formed on the entire surface inclusive of the lower electrode; and an upper electrode formed on the dielectric layer.

In another aspect, there is provided a method for manufacturing a capacitor of a semiconductor device including the steps of providing a substrate; forming an insulating layer having a contact hole on the substrate; forming a plug in the contact hole; forming a lower electrode having a first conductive layer and a conductive oxide layer, and a second conductive layer; and successively forming a dielectric layer and an upper layer on the entire surface inclusive of the lower electrode.

It is to be understood that both the foregoing general description and the following detailed description are exemplary and explanatory and are intended to provide further explanation of the invention as claimed.

Other objects and further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

These and various other objects, features, and advantages of the present invention will be readily understood with reference to the following detailed description read in conjunction with the accompanying drawings, in which.

DETAILED DESCRIPTION OF THE PREFERRED EMBODIMENTS

Reference will now be made in detail to the preferred embodiments of the present invention, examples of which are illustrated in the accompanying drawings.

Figure 5:
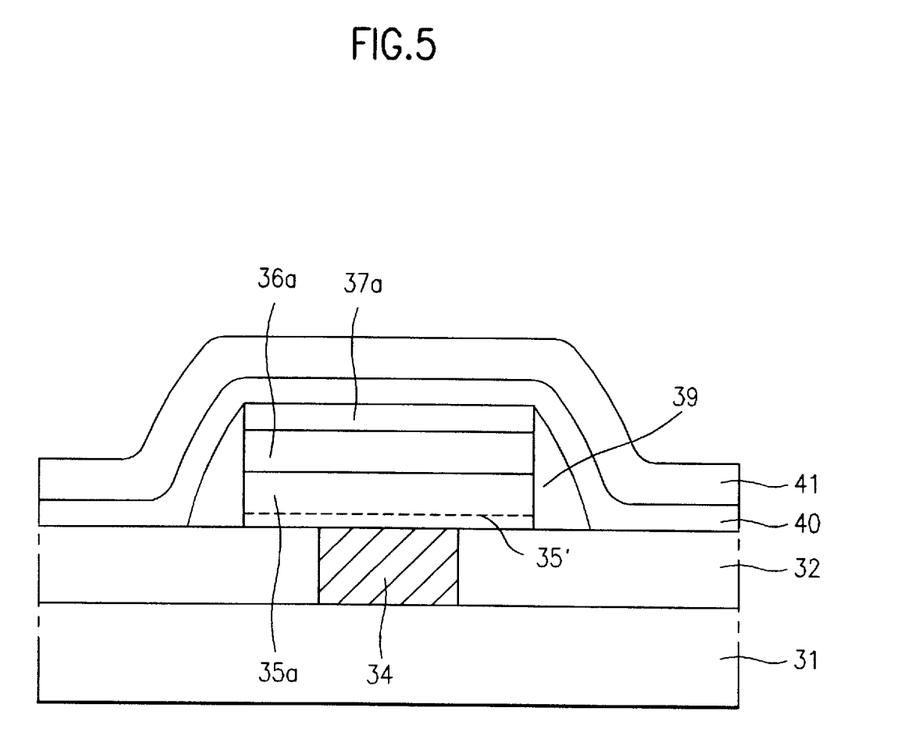
FIG. 5 is a cross-sectional view showing a structure of a capacitor of a semiconductor device according to a first embodiment of the invention.

FIG. 5 is a cross-sectional view showing an example of a structure of a capacitor of a semiconductor device according to the first embodiment of the invention.

As shown in FIG. 5, an insulating layer 32 having a contact hole of a predetermined width is formed on a silicon substrate 31. Then a polysilicon plug 34 filling the contact hole up to the top surface of the insulating layer 32 is formed on the substrate 31.

Subsequently, a ruthenium (RU) layer pattern 35a, a ruthenium (RU) oxide layer pattern 36a, and a platinum (Pt) layer pattern 37a are sequentially formed on the polysilicon plug 34 and the portions of the insulating layer 32 adjoining the polysilicon plug 34. A diffusion prevention layer 35' made of TiN, TiW, or TaN may be formed on a lower portion of the Ru layer pattern 35a. Insulating sidewalls 39 are formed on the sides of the patterns 35a, 36a, and 37a. A dielectric layer 40 and another platinum (Pt) layer 41 are sequentially formed on the entire surface inclusive of the insulating sidewalls 39. The Pt layer 41 functions as an upper electrode of the capacitor. The Ru layer pattern 35a, the Ru oxide layer pattern 36a, and the Pt layer pattern 37a constitute the lower electrode of the capacitor.

Any one of ruthenium (Ru), platinum (Pt), iridium (Ir), and tin (Sn) is used as the lower and upper electrodes. The Ru oxide layer pattern 36a is composed of any one of ruthenium oxide (RuOx), iridium oxide (IrOx), tin oxide (SnOx), and yttrium barium copper oxide ($YBCO_3$). The Ru oxide layer pattern 36a is a conductive oxide layer. The dielectric layer 40 is composed of any one of PZT ($PbZrTiO_3$: lead zirconium titanium oxide), PLZT ($PbLiZrTiO_3$: lead lithium zirconium titanium oxide), BST (($BaSr)TiO_3$: barium strontium titanium oxide), $BaTiO_3$ (barium titanium oxide), and STO ($SrTiO_3$: strontium titanium oxide)

Referring to FIGS. 6a through 6f, there is illustrated a method for forming a capacitor of a semiconductor device according to the first embodiment of the invention.

Figure 6A:
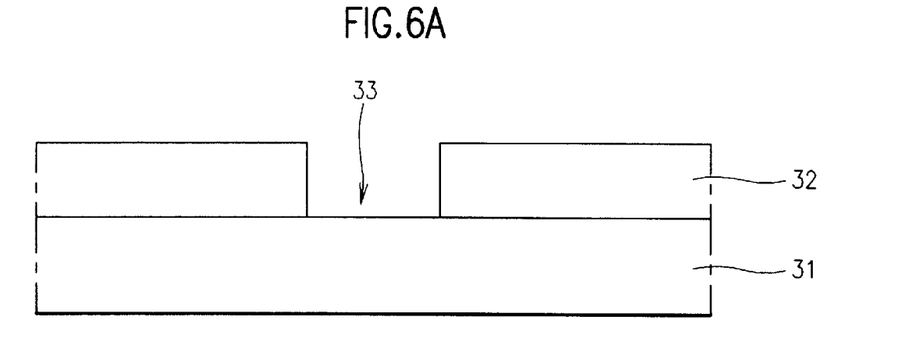
FIGS. 6a to 6f are cross-sectional views for explaining a method for manufacturing a capacitor of a semiconductor device according to the first embodiment of the invention.

As shown in FIG. 6a, an oxide layer 32 is formed on a silicon substrate 31. Then a first photoresist layer (not shown) is coated on the oxide layer 32. By using a photolithography and photo etching process the oxide layer 32 is selectively removed, thereby exposing a predetermined portion of the silicon substrate 31 to form a contact hole 33.

Figure 6B:
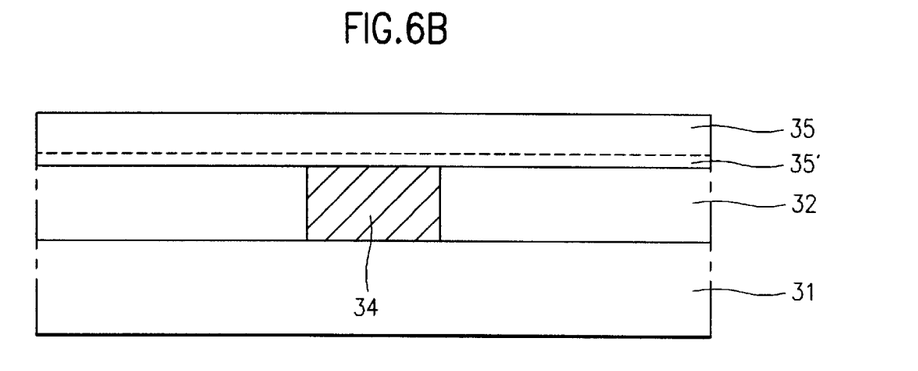

As shown in FIG. 6b, a polysilicon is formed on the oxide layer 32 and in the contact hole 33, and selectively removed so that the polysilicon fills the contact hole as a polysilicon plug 34. The top surface of the polysilicon plug 34 is flush with the top surface of the oxide layer 32. A ruthenium (Ru) layer 35 is formed on the polysilicon plug 34 and oxide layer 32. A diffusion prevention layer 35' made of TiN, TiW, or TaN may be formed on a lower portion of the Ru layer 35. Any one of ruthenium, platinum, iridium, and tin is used to form the Ru layer 35.

Figure 6C:
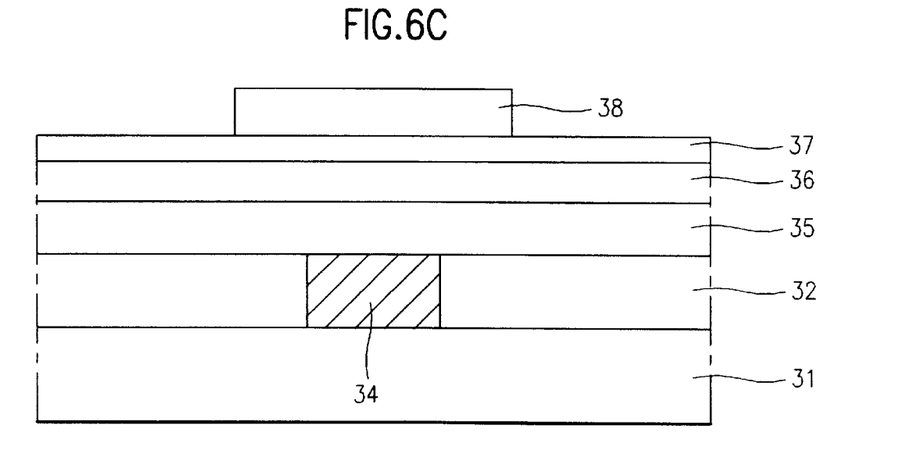

As shown in FIG. 6c, a ruthenium (Ru) oxide layer 36 is formed on the Ru layer 35 by a reactive sputtering method, a thermal oxidation method, or a plasma oxidation method. A first platinum (Pt) layer 37 is formed on the Ru oxide layer 36. As the thickness of the first Pt layer 37 increases, the amount of leakage current being generated decreases due to schottky-emission. But in a wet etch, significant under-cut may be generated. Thus the first Pt layer 37 is formed to have a minimal thickness of 5 nm to avoid degradation of electric characteristics.

In this case, even though the first Pt layer 37 is 5 nm thick, the leakage current characteristics are not decreased. Furthermore, the under-cuts are prevented in a wet etch process so that patterns can be formed by the wet etch and a time of dry etch is decreased.

Subsequently, a second photoresist layer 38 is coated on the first Pt layer 37 and subjected to exposure and development for patterning. In this case, any one of ruthenium oxide (RuOx), iridium oxide (IrOx), tin oxide (SnOx), and yttrium barium copper oxide ($YBCO_3$) is used as the Ru oxide layer 36 which is a conductive oxide layer. The first Pt layer 37 is formed with any one of ruthenium Ru), platinum (Pt), iridium (Ir), and tin (Sn).

Figure 6D:
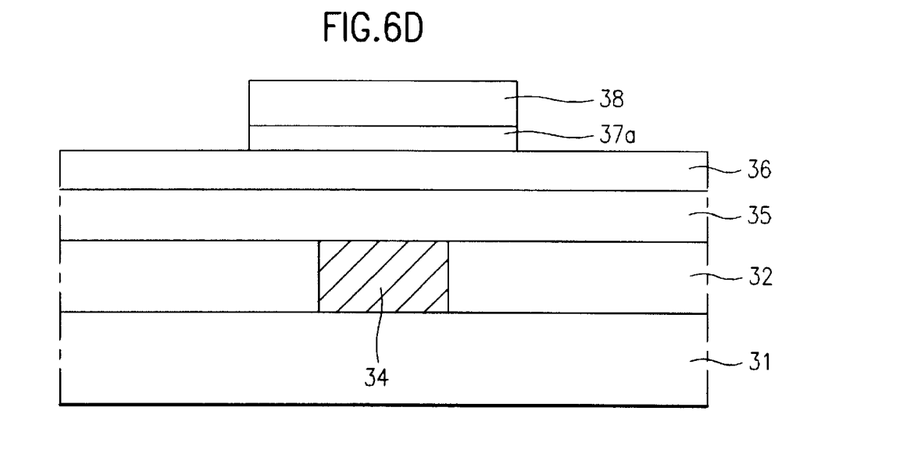

As shown in FIG. 6d, with the second photoresist layer 38 serving as a mask, the first Pt layer 37 is selectively removed by a wet etch using an etchant such as aqua regia, or with an etching gas containing chlorine (Cl), so as to form a first Pt layer pattern 37a. When the first Pt layer 37 is wet etched with an aqua regia, the Ru oxide layer 36 is not affected by the aqua regia so that the wet etch self-stops at the first Pt layer 37 prior to reaching the Ru oxide layer 36. Thus, generation of under-cuts is prevented.

Figure 6E:
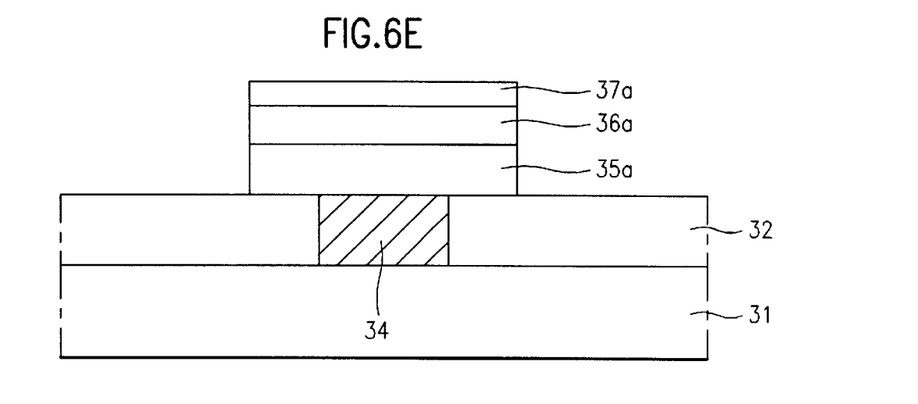

As shown in FIG. 6e, the second photoresist layer 38 is completely removed. With the first Pt layer pattern 37a serving as a mask, the Ru oxide layer 36 and the Ru layer 35 are successively dry-etched using an etching gas containing oxygen so as to form a Ru oxide layer pattern 36a and a Ru layer pattern 35a.

Figure 6F:
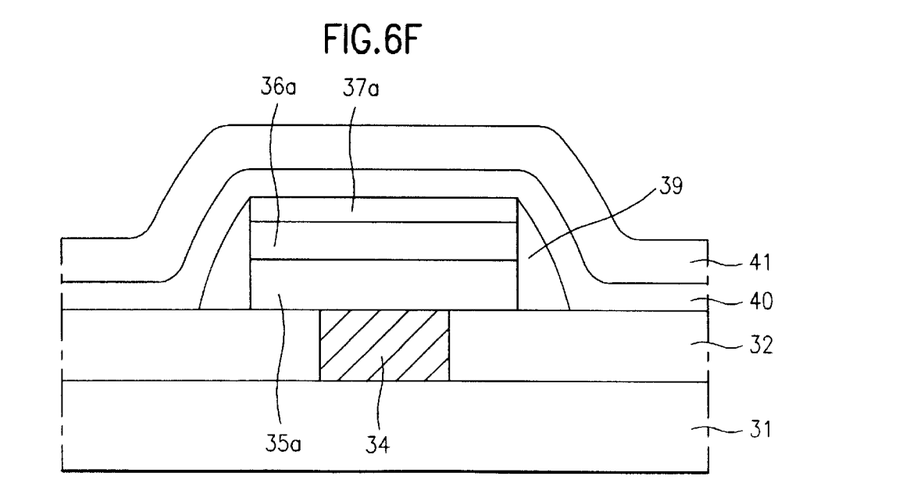

As shown in FIG. 6f, an insulating layer is formed on the entire surface inclusive of the first Pt layer pattern 37a and etched back, so that insulating sidewalls 39 are formed on the sides of the first Pt layer pattern 37a, Ru oxide layer pattern 36a, and Ru layer pattern 35a. A dielectric layer 40 and a second Pt layer 41 are successively formed on the entire surface inclusive of the insulating sidewalls 39 by a thin film forming method. The thin film forming method may be, for example, a sputtering method or a chemical vapor deposition (CVD) method.

The lower electrode of the capacitor includes the Ru layer pattern 35a, the Ru oxide layer pattern 36a, and the first Pt layer pattern 37a. The second Pt layer 41 serves as the upper electrode. The dielectric layer 40 is positioned between the lower electrode and the upper electrode, thus completing the capacitor. The dielectric layer 40 is formed with any one of PbZrTiO$_3$ (PZT), PbLiZrTiO$_3$ (PLZT), (BaSr)TiO$_3$ (BST), BaTiO$_3$, and SrTiO$_3$ (STO).

Figure 7:
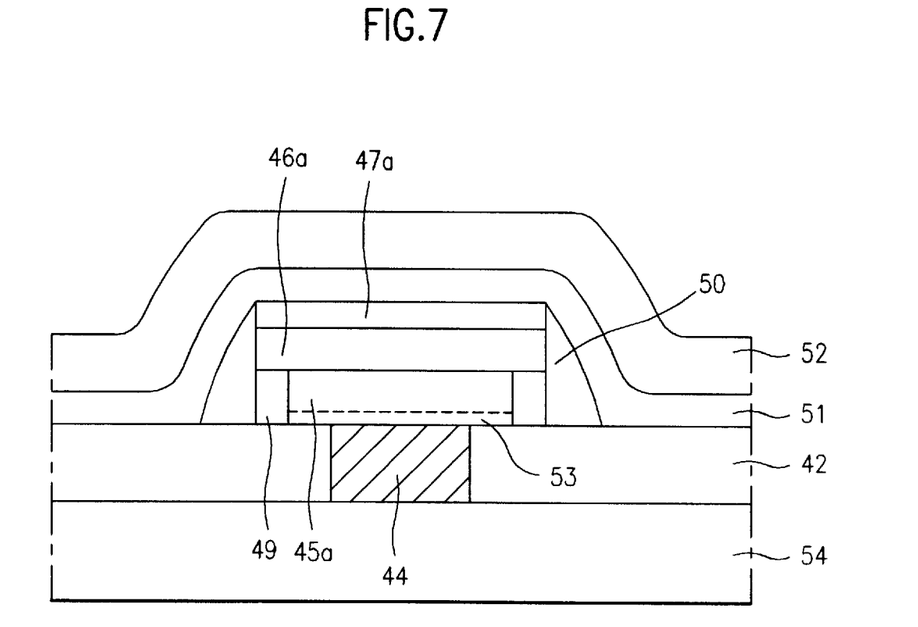
FIG. 7 is a cross-sectional view showing a structure of a capacitor of a semiconductor device according to a second embodiment of the invention.

FIG. 7 is a cross-sectional view showing a structure of a capacitor of a semiconductor device according to the second embodiment of the invention.

As shown in FIG. 7, an insulating layer 42 having a contact hole of a predetermined width is formed on a silicon substrate 54. A silicon plug 44 fills the contact hole up to the top surface of the insulating layer 42. A Ru (ruthenium) layer pattern 45a is formed on the silicon plug 44 and the portions of the insulating layer 42 adjoining the silicon plug 44. A diffusion prevention layer 53 may be formed between the plug 44 and the Ru layer 45. Subsequently, first and second Ru oxide layer patterns 46a and 49 are formed over the Ru layer pattern 45a. Then a first Pt (platinum) layer pattern 47a is formed on the Ru oxide layer pattern 46a. Pt layer sidewalls 50 made of a second Pt layer are formed on the sides of the first and second Ru oxide layer patterns 46a and 49 and the first Pt layer pattern 47a. A dielectric layer 51 and a third Pt layer 52 are formed on the entire surface inclusive of the Pt layer sidewalls 50. The third Pt layer 52 functions as an upper electrode of the capacitor.

Referring to FIGS. 8a through 8f, there are illustrated process steps of a method for manufacturing a capacitor of a semiconductor device according to the second embodiment of the invention.

Figure 8A:
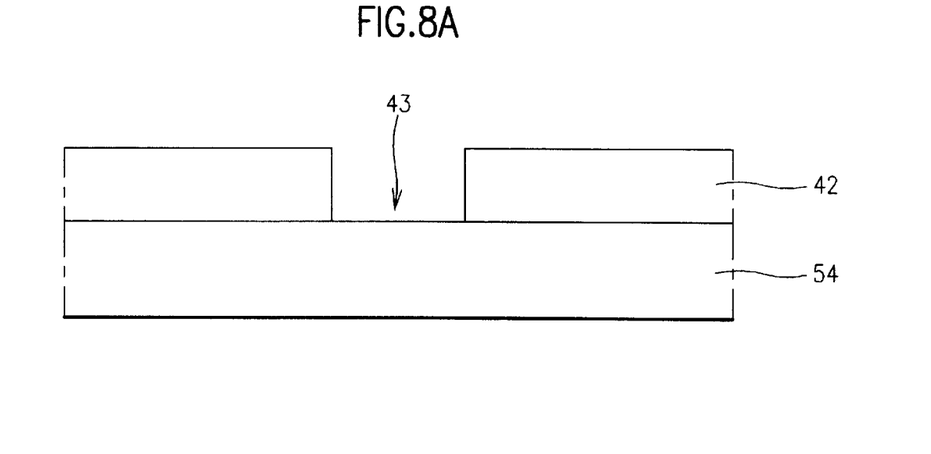
FIGS. 8a to 8f are cross-sectional views for explaining a method for manufacturing a capacitor of a semiconductor device according to the second embodiment of the invention.

First, an oxide layer 42 is formed on a silicon substrate 54, as shown in FIG. 8a. A first photoresist layer (not shown) is coated on the oxide layer 42. Using photolithography and photo etching, the oxide layer 42 is selectively removed to expose a predetermined portion of the surface of the silicon substrate 42, thus forming a contact hole 43.

Figure 8B:
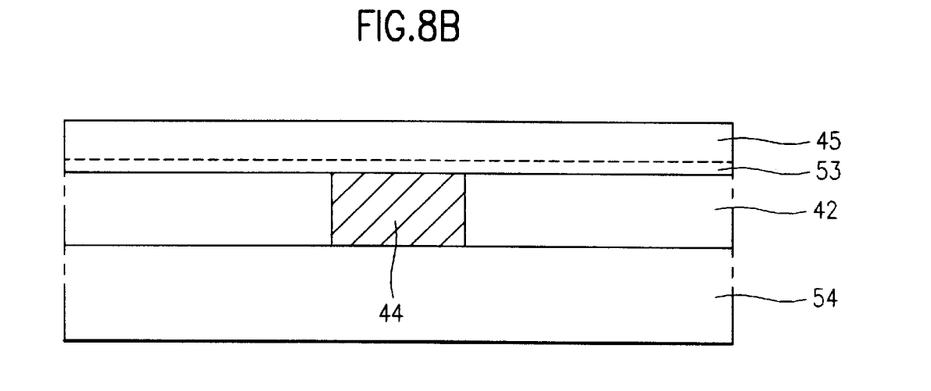

As shown in FIG. 8b, a polysilicon is deposited on the entire surface inclusive of the contact hole 43 and selectively removed so that the polysilicon remains only in the contact hole 43. This forms a polysilicon plug 44 flush with the insulating layer 42. A ruthenium (Ru) layer 45 is formed on the polysilicon plug 44 and the oxide layer 42. A diffusion prevention layer 53 made of Tin, TiW, or TaN may be formed in a lower portion of the Ru layer 45.

Figure 8C:
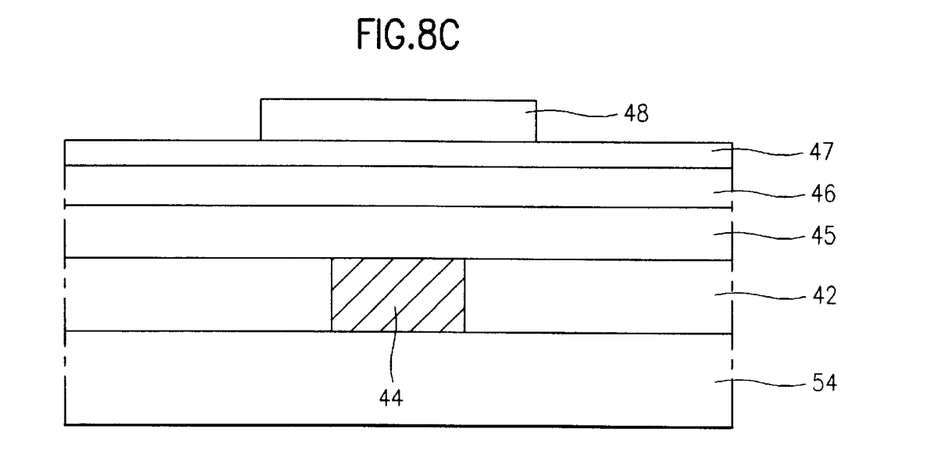

As shown in FIG. 8c, a first Ru oxide layer 46 is formed on the Ru layer 45 by a reactive sputtering method, a thermal oxidation method, or a plasma oxidation method. Then a first Pt layer 47 is formed on the first Ru oxide layer 46. As the thickness of the first Pt layer 47 increases, less leakage current is generated due to schottky-emission. However, under-cuts may be generated in a wet etch. Thus, it is preferable to form the first Pt layer 47 with a minimal thickness, e.g., 10 nm, so as to avoid degradation of electric characteristics. Here, the thickness of the first Pt layer 47 is equal to or less than 10 nm so that the leakage current characteristics are not deteriorated and the under-cuts are prevented during the wet etch. Accordingly, accurate patterning is possible using a wet etch and a time of dry etch is shortened.

On the first Pt layer 47, a second photoresist layer 48 is coated and subjected to exposure and development to form a second photoresist layer 48.

Figure 8D:
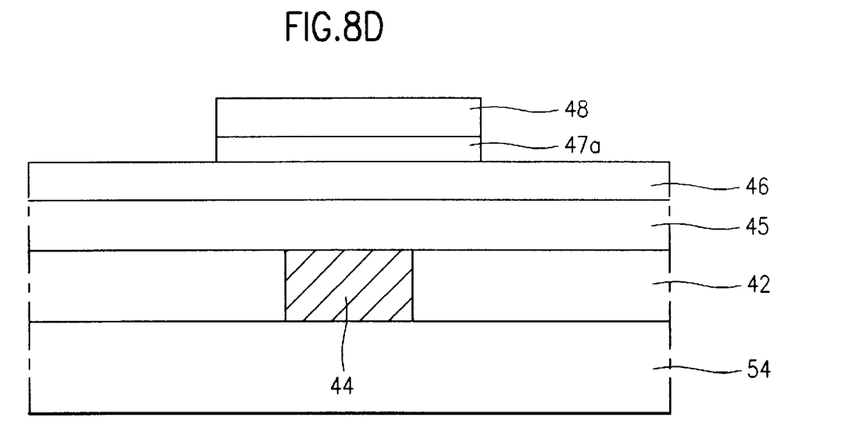

As shown in FIG. 8d, with the second photoresist layer 48 serving as a mask, the first Pt layer 47 is selectively removed by a wet etch using an etchant such as an aqua regia or an etching gas containing chlorine, so as to form a first Pt layer pattern 47a is formed. In wet etching the Pt layer 47 using an aqua regia, etching of the first Ru oxide layer 46 is prevented. The wet etch self-stops at the first Pt layer 47 prior to reaching the first Ru oxide layer 46, and thus the under-cuts are prevented.

Figure 8E:
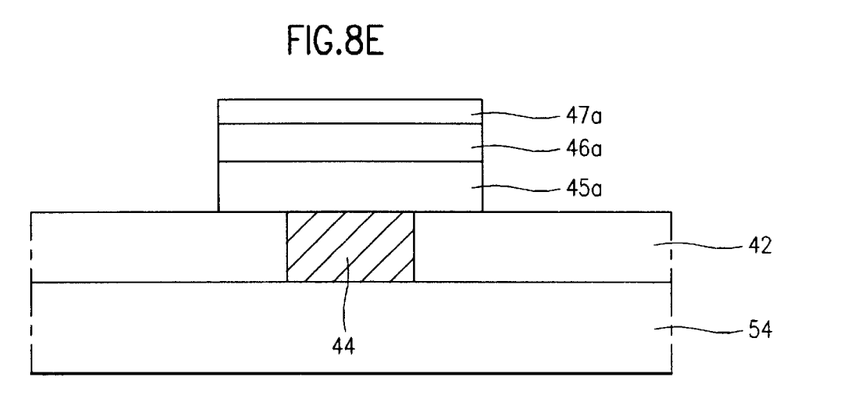

As shown in FIG. 8e, the remaining second photoresist layer 48 is completely removed. With the first Pt layer pattern 47a serving as a mask, the first Ru oxide layer 46 and the Ru layer 45 are dry-etched using an etching gas containing oxygen so as to form a first Ru oxide layer pattern 46a and a Ru layer pattern 45a.

Figure 8F:
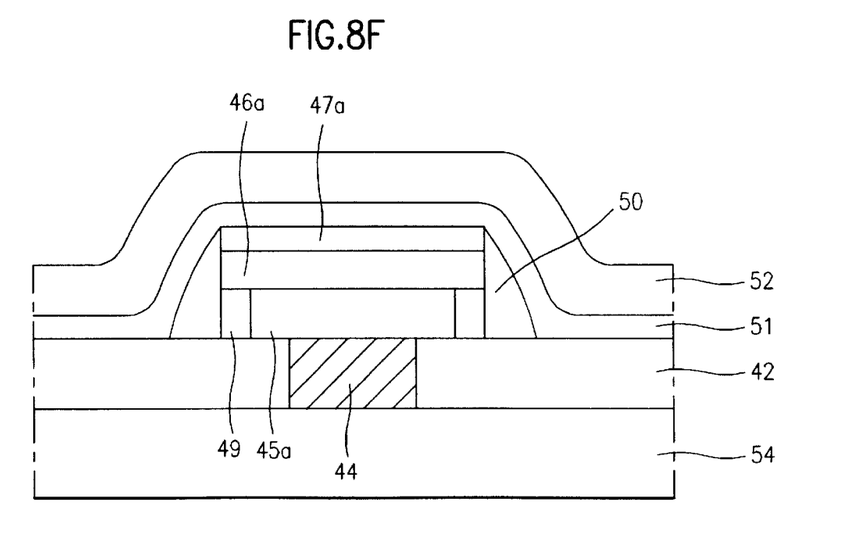

As shown in FIG. 8f, the sides of the Ru layer pattern 45a are oxidized by a thermal oxidation method or a plasma oxidation method, thereby forming a second Ru oxide layer pattern 49. Subsequently a second Pt layer is formed on the entire surface inclusive of the second Ru oxide layer pattern 49. By performing an etch back on the second Pt layer, Pt layer sidewalls 50 are formed on both sides of the first and second Ru oxide layer patterns 46a and 49 and the first Pt layer pattern 47a. A dielectric layer 51 and a third Pt layer 52 which serves as an upper electrode are successively formed on the entire surface by a thin film-forming method such as a sputtering method or a CVD method, thereby completing the capacitor of a semiconductor device.

Figure 9:
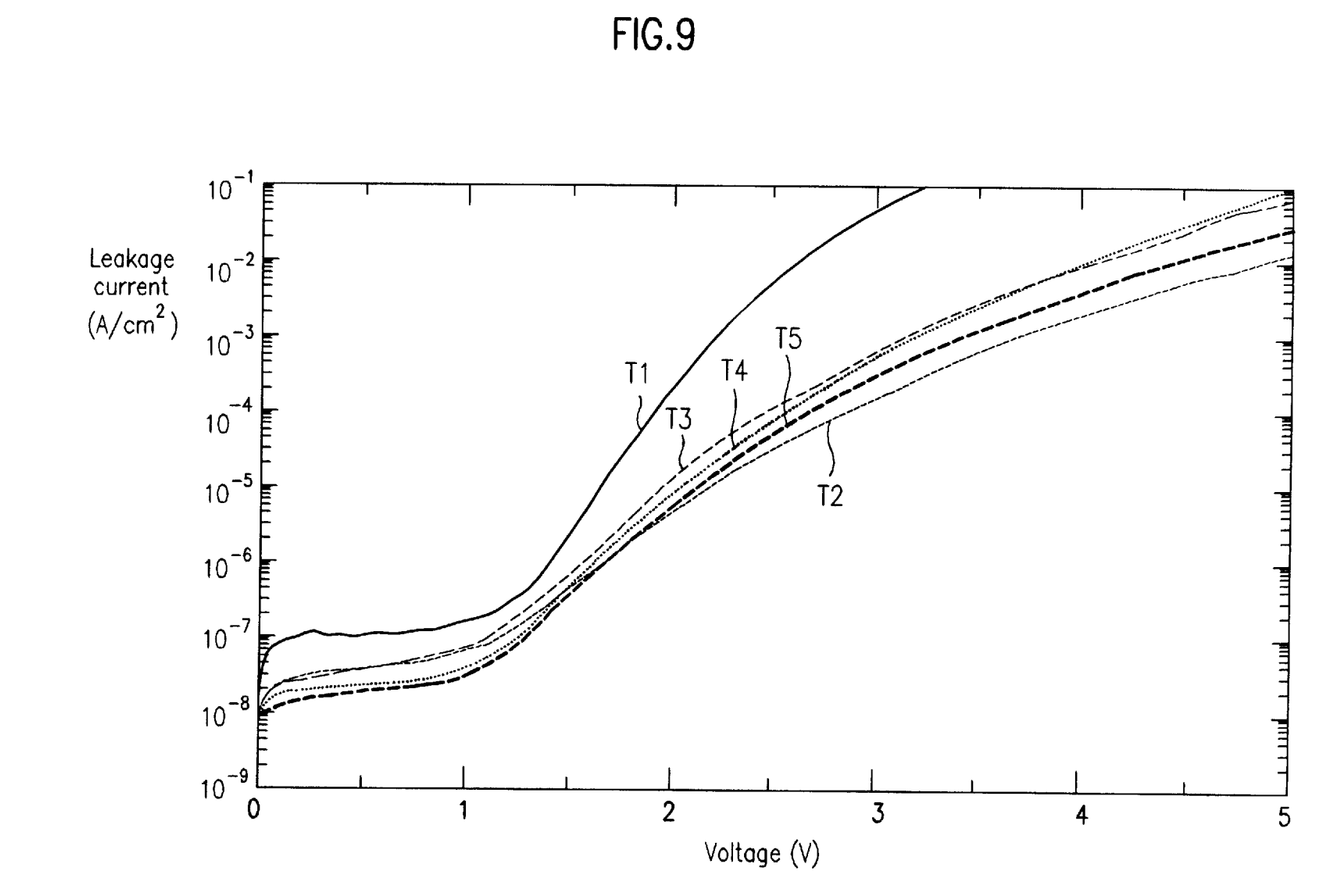
FIG. 9 is a graph showing leakage current characteristics of the capacitor with respect to various thicknesses of a platinum layer according to the embodiments of the invention.

FIG. 9 is a graph showing a relation between leakage current characteristics of a lower electrode of the capacitor and an applied voltage for various thicknesses of a Pt layer according to the embodiments of the present invention. T1, T2, T3, T4 and T5 represent the Pt layer thickness of 0 Angstrom, 50 Angstroms, 100 Angstroms, 300 Angstroms, and 500 Angstroms, respectively.

As described above, a thin Pt layer is first formed on a Ru oxide/Ru layer and then a dielectric layer is formed on the thin Pt layer. FIG. 9 shows that the leakage current characteristics are not deteriorated even when the thickness of the Pt layer is 5 nm. Therefore, the electric characteristic of the semiconductor device is improved by forming a thin Pt layer as a lower electrode of the capacitor.

The capacitor and the manufacturing method according to the embodiments of the present invention have the following additional advantages.

First, the lower electrode of the capacitor according to the present invention includes a thin Pt layer, a Ru layer and a Ru oxide layer. Since the Pt layer is considerably thinner than that in the conventional capacitor, a more precise pattern is formed by an etching process.

Second, a thin Pt layer is formed on a Ru oxide layer which is formed on a Ru layer so that generation of leakage current is prevented.

It will be apparent to those skilled in the art that various modification and variations can be made in the capacitor of a semiconductor device and a method for manufacturing the same of the present invention without departing from the spirit or scope of the inventions. Thus, it is intended that the present invention cover the modifications and variations of this invention provided they come within the scope of the appended claims and their equivalents.

What is claimed is:

1. A method for manufacturing a capacitor of a semiconductor device, the method comprising the steps of:
    providing a substrate;
    forming an insulating layer having a contact hole therein;
    forming a plug in the contact hole;
    forming a first conductive layer, a first conductive oxide layer and a second conductive layer on the plug, wherein the first conductive layer, the first conductive oxide layer, and the second conductive layer form a lower electrode, and the first and second conductive layers are aligned to each other;
    performing an oxidizing operation on side portions of the first conductive layer formed beneath the first conductive oxide layer to form a second conductive oxide layer on sides of the first conductive layer;
    forming a dielectric layer on the lower electrode; and
    forming an upper electrode on the dielectric layer.

2. The method as claimed in claim 1, further comprising the step of:
    forming insulating sidewalls on sides of the first conductive oxide layer, the second conductive oxide layer, and the second conductive layer.

3. The method as claimed in claim 1, further comprising the step of:
    forming sidewalls made of a third conductive layer on sides of the first conductive oxide layer, the second conductive oxide layer, and the second conductive layer.

4. The method as claimed in claim 3, wherein the third conductive layer is made of any one of ruthenium (Ru), platinum (Pt), iridium (Ir), and tin (Sn).

5. The method as claimed in claim 1, wherein each of the first and second conductive layers is made of one of ruthenium (Ru), platinum (Pt), iridium (Ir), and tin (Sn).

6. The method as claimed in claim 1, wherein the conductive oxide layer is made of any one of ruthenium oxide (RuOx), iridium oxide (IrOx), tin oxide (SnOx), and yttrium barium copper oxide ($YBCO_3$).

7. The method as claimed in claim 1, wherein the dielectric layer is made of any one of $PbZrTiO_3$ (PZT), $PbLiZrTiO_3$ (PLZT), $(BaSr)TiO_3$ (BST), $BaTiO_3$, and $SrTiO_3$ (STO).

8. The method as claimed in claim 1, wherein the upper electrode is made of any one of ruthenium (Ru), platinum (Pt), iridium (Ir), and tin (Sn).

9. The method as claimed in claim 1, wherein the plug is made of polysilicon.

10. The method as claimed in claim 1, further comprising the step of:
    forming sidewalls on sides of the second conductive layer, the first conductive oxide layer and the second conductive oxide layer.

11. The method as claimed in claim 1, wherein the first conductive oxide layer is formed by sputtering.

12. The method as claimed in claim 1, further comprising the step of:
    forming an impurity diffusion region in the substrate facing the plug.

13. The method as claimed in claim 1, wherein the dielectric layer is formed by one of a sputtering process and a chemical vapor deposition.

14. The method as claimed in claim 1, wherein the second conductive layer has a thickness of approximately 5–10 nm so as to prevent degradation of electric characteristics.

15. The method as claimed in claim 1, further comprising the step of:
    forming a diffusion prevention layer between the plug and the first conductive layer.

* * * * *